(12) United States Patent
Zhang et al.

(10) Patent No.: US 10,957,605 B2
(45) Date of Patent: Mar. 23, 2021

(54) VFET DEVICE DESIGN FOR TOP CONTACT RESISTANCE MEASUREMENT

(71) Applicant: International Business Machines Corporation, Armonk, NY (US)

(72) Inventors: Chen Zhang, Albany, NY (US); Zuoguang Liu, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/592,681

(22) Filed: Oct. 3, 2019

(65) Prior Publication Data
US 2020/0035565 A1    Jan. 30, 2020

Related U.S. Application Data

(62) Division of application No. 15/843,318, filed on Dec. 15, 2017, now Pat. No. 10,622,257.

(51) Int. Cl.
*H01L 29/66* (2006.01)
*H01L 27/088* (2006.01)
(Continued)

(52) U.S. Cl.
CPC ........... *H01L 21/823487* (2013.01); *H01L 21/823425* (2013.01); *H01L 21/823475* (2013.01); *H01L 21/823481* (2013.01); *H01L 22/14* (2013.01); *H01L 22/32* (2013.01); *H01L 22/34* (2013.01); *H01L 27/088* (2013.01); *H01L 29/66666* (2013.01)

(58) Field of Classification Search
CPC .................................................. H01L 29/0642
See application file for complete search history.

(56) References Cited

U.S. PATENT DOCUMENTS

| 4,896,108 A | 1/1990 | Lynch et al. |
| 7,037,994 B2 | 5/2006 | Sugita et al. |

(Continued)

OTHER PUBLICATIONS

T.F. Lei et al., "Specific contact resistivity measurement by a vertical Kelvin test structure," IEEE Transactions on Electron Devices, vol. 34, No. 6, Jun. 1987, pp. 1390-1395.

(Continued)

*Primary Examiner* — Omar F Mojaddedi
(74) *Attorney, Agent, or Firm* — Randall Bluestone; Michael J. Chang, LLC

(57) ABSTRACT

The present invention provides VFET device designs for top contact resistance measurement. In one aspect, a method of forming a VFET test structure includes: etching fins in a substrate (for active and sensing devices); forming bottom source/drains at a base of the fins; forming a STI region that isolates the bottom source/drains of the active device from that of the sensing device; forming a gate surrounding each of the fins; forming top source/drains over the gate, wherein the top source/drains of the active device and that of the sensing device are merged; and forming contacts to i) the bottom source/drains of the active device, ii) the top source/drains of the active device, and iii) the bottom source/drains of the sensing device. A test structure formed by the method as well as techniques for use thereof for measuring contact resistance are also provided.

20 Claims, 15 Drawing Sheets

(51) Int. Cl.
*H01L 29/786* (2006.01)
*H01L 29/423* (2006.01)
*H01L 29/78* (2006.01)
*H01L 29/775* (2006.01)
*H01L 29/06* (2006.01)
*H01L 21/8234* (2006.01)
*H01L 21/66* (2006.01)

(56) References Cited

U.S. PATENT DOCUMENTS

| | | | |
|---|---|---|---|
| 7,042,007 | B2 | 5/2006 | Yasui et al. |
| 7,244,549 | B2 | 7/2007 | Iwasawa et al. |
| 7,303,855 | B2 | 12/2007 | Hatakeyama et al. |
| 7,358,025 | B2 | 4/2008 | Hatakeyama |
| 8,115,503 | B2 | 2/2012 | Vinet |
| 8,138,039 | B2 | 3/2012 | Tang et al. |
| 8,598,579 | B2 | 12/2013 | Chumakov et al. |
| 8,779,794 | B2 | 7/2014 | Bernoux et al. |
| 9,453,873 | B2 | 9/2016 | Chen et al. |
| 9,536,943 | B2 | 1/2017 | Tamaki |
| 9,627,280 | B2 | 4/2017 | Wann et al. |
| 2011/0108803 | A1* | 5/2011 | Deligianni ............ H01L 29/775 257/24 |
| 2012/0242356 | A1 | 9/2012 | Ohuchi et al. |
| 2013/0122686 | A1 | 5/2013 | Chang et al. |
| 2017/0067955 | A1 | 3/2017 | Moll et al. |
| 2018/0138046 | A1* | 5/2018 | Bentley ............. H01L 29/42392 |
| 2019/0051757 | A1* | 2/2019 | Bourjot ............. H01L 29/66666 |

OTHER PUBLICATIONS

S. Oussalah et al., "A comparative study of different contact resistance test structures dedicated to the power process technology," Solid-State Electronics, vol. 49, No. 10, Oct. 2005, pp. 1617-1622.

List of IBM Patents or Applications Treated as Related (2 pages).

* cited by examiner

VFET DEVICE DESIGN FOR TOP CONTACT RESISTANCE MEASUREMENT

CROSS-REFERENCE TO RELATED APPLICATIONS

This application is a divisional of U.S. application Ser. No. 15/843,318 filed on Dec. 15, 2017, now U.S. Pat. No. 10,622,257, the contents of which are incorporated by reference herein.

FIELD OF THE INVENTION

The present invention relates to vertical field effect transistor (VFET) devices, and more particularly, to VFET device designs for top contact resistance measurement.

BACKGROUND OF THE INVENTION

As opposed to planar complementary metal oxide semiconductor (CMOS) devices, vertical field effect transistors (VFETs) are oriented with a vertical fin channel disposed on a bottom source and drain, and a top source and drain disposed on the fin channel. Following fabrication of the VFET device, top contacts are often formed to the top and bottom source and drains. VFETs are being explored as a viable device option for continued CMOS scaling beyond the 7 nanometer (nm) technology node.

Top contact resistance (Rc) is an important factor in VFET device performance. For instance, top contact resistance can impact the switching characteristics of the device.

Accordingly, techniques for accurately and effectively determining top contact resistance in a VFET device would be desirable.

SUMMARY OF THE INVENTION

The present invention provides vertical field effect transistor (VFET) device designs for top contact resistance measurement. In one aspect of the invention, a method of forming a VFET contact resistance test structure is provided. The method includes the following steps. Fins are etched in a substrate, wherein at least a first one of the fins serves as a vertical fin channel of an active VFET device and at least a second one of the fins serves as a vertical fin channel of a sensing VFET device; bottom source and drains are formed at a base of the fins; bottom spacers are formed on the bottom source and drains; a shallow trench isolation (STI) region is formed in the substrate in between the at least one first fin and the at least one second fin that provides isolation of the bottom source and drains of the active VFET device from the bottom source and drains of the sensing VFET device; a gate is formed surrounding each of the fins; top spacers are formed on the gate; top source and drains are formed over the gate, wherein the top source and drains of the active VFET device and the top source and drains of the sensing VFET device are merged; and contacts are formed to i) the bottom source and drains of the active VFET device, ii) the top source and drains of the active VFET device, and iii) the bottom source and drains of the sensing VFET device.

In another aspect of the invention, a VFET contact resistance test structure is provided. The VFET contact resistance test structure includes: fins patterned in a substrate, wherein at least a first one of the fins serves as a vertical fin channel of an active VFET device and at least a second one of the fins serves as a vertical fin channel of a sensing VFET device; bottom source and drains at a base of the fins; a STI region in the substrate in between the at least one first fin and the at least one second fin that provides isolation of the bottom source and drains of the active VFET device from the bottom source and drains of the sensing VFET device; a gate surrounding each of the fins; top source and drains over the gate, wherein the top source and drains of the active VFET device and the top source and drains of the sensing VFET device are merged; and contacts to i) the bottom source and drains of the active VFET device, ii) the top source and drains of the active VFET device, and iii) the bottom source and drains of the sensing VFET device.

In yet another aspect of the invention, a method for measuring contact resistance is provided. The method includes the following steps. A VFET test structure is formed having: fins patterned in a substrate, wherein at least a first one of the fins serves as a vertical fin channel of an active VFET device and at least a second one of the fins serves as a vertical fin channel of a sensing VFET device; bottom source and drains at a base of the fins; a STI region in the substrate in between the at least one first fin and the at least one second fin that provides isolation of the bottom source and drains of the active VFET device from the bottom source and drains of the sensing VFET device; a gate surrounding each of the fins; top source and drains over the top spacer, wherein the top source and drains of the active VFET device and the top source and drains of the sensing VFET device are merged; and contacts including: i) a first contact to the bottom source and drains of the active VFET device, ii) a second contact to the top source and drains of the active VFET device, iii) a third contact to the bottom source and drains of the sensing VFET device, and iv) a fourth contact to the gate. A voltage Vd is applied to the first contact to force a drain-source current Ids between the first contact and the second contact, whereby current flows only in the active VFET device based on the isolation of the bottom source and drains of the active VFET device from the bottom source and drains of the sensing VFET device. A potential Vmeas is measured at the third contact. Contact resistance Rc is determined using Ids and Vmeas (e.g., as $Rc = V_{meas}/I_{ds}$).

A more complete understanding of the present invention, as well as further features and advantages of the present invention, will be obtained by reference to the following detailed description and drawings.

DETAILED DESCRIPTION OF PREFERRED EMBODIMENTS

Provided herein is a vertical field effect transistor (VFET) test structure and techniques for use thereof for precisely measuring contact resistance in a VFET device design. As provided above, a VFET device includes a vertical fin channel disposed on a bottom source and drain, and a top source and drain disposed on the fin channel. Contacts are then formed to the top and bottom source and drains.

As will be described in detail below, the present techniques involve fabricating both active and sensing VFET devices on a common substrate. The bottom source and drains of the active VFET devices are, however, isolated from the bottom source and drains in the sensing VFET device. Thus, when a drain-source current Ids is passed through the active VFET devices, no current will flow through the (isolated) sensing VFET device. As such, there will be no voltage drop to the voltage measured at the top source and drain of the sensing VFET device (Vmeas). From Ids and Vmeas, the contact resistance Rc can be determined as follows:

$$Rc = V_{meas}/I_{ds}. \quad (1)$$

Figure 1:
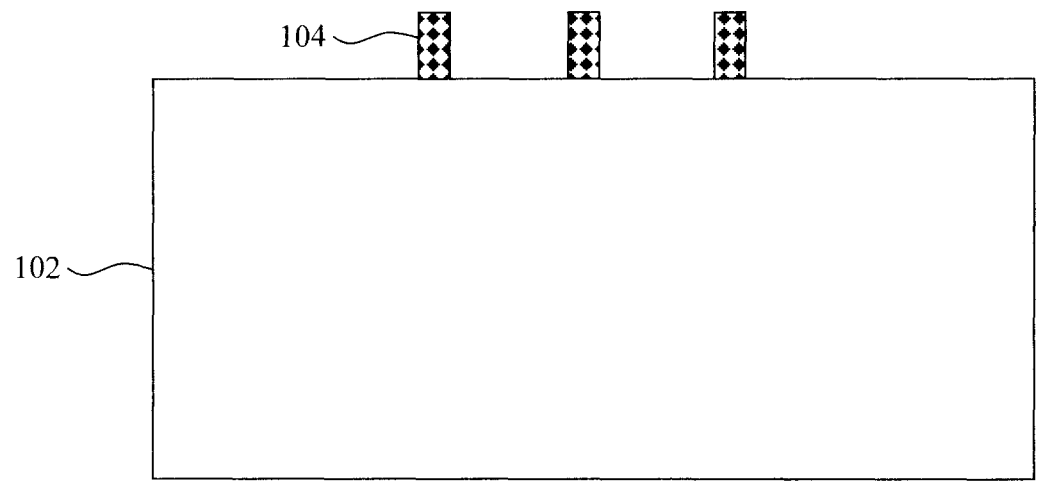
FIG. 1 is a cross-sectional diagram illustrating a starting structure for forming a vertical field effect transistor (VFET) test structure including fin hardmasks having been formed on a substrate according to an embodiment of the present invention.

An exemplary methodology for forming the present VFET test structure is now described by way of reference to FIGS. 1-23. As shown in FIG. 1, the process begins with a substrate 102. According to an exemplary embodiment, the substrate 102 is undoped.

A variety of different substrate 102 configurations can be implemented in accordance with the present techniques. For instance, according to one exemplary embodiment, the starting substrate 102 is a bulk semiconductor wafer, such as a bulk silicon (Si), bulk germanium (Ge) and/or bulk silicon germanium (SiGe) wafer. Alternatively, substrate 102 can be a semiconductor-on-insulator (SOI) wafer. In general, a SOI wafer includes a SOI layer separated from an underlying substrate by a buried insulator. When the buried insulator is an oxide it is referred to as a buried oxide or BOX. The SOI layer can include any suitable semiconductor, such as Si, Ge and/or SiGe.

As shown in FIG. 1, fin hardmasks 104 are next formed on the substrate 102. The fin hardmasks 104 will mark the footprint and location of one or more vertical fin channels to be patterned in the substrate 102.

A variety of different techniques are contemplated herein for forming the fin hardmasks 104 on the substrate 102. According to one exemplary embodiment, a direct patterning approach is employed whereby a hardmask material is first deposited onto the substrate 102. Standard lithography and etching techniques are then used to pattern the hardmask material into the individual fin hardmasks 104. Suitable hardmask materials include, but are not limited to, nitride hardmask materials, such as silicon nitride (SiN).

Alternatively, an approach such as sidewall image transfer (SIT) can be employed to form the fin hardmasks 104. An advantage to an SIT process is that SIT permits the patterning of feature sizes below that which can be achieved using direct patterning. A suitable SIT process that may be used in accordance with the present techniques is described, for example, in U.S. Pat. No. 9,123,654 issued to Effendi Leobandung, entitled "Trilayer SIT Process with Transfer Layer for FINFET Patterning," the contents of which are incorporated by reference as if fully set forth herein.

Figure 2:
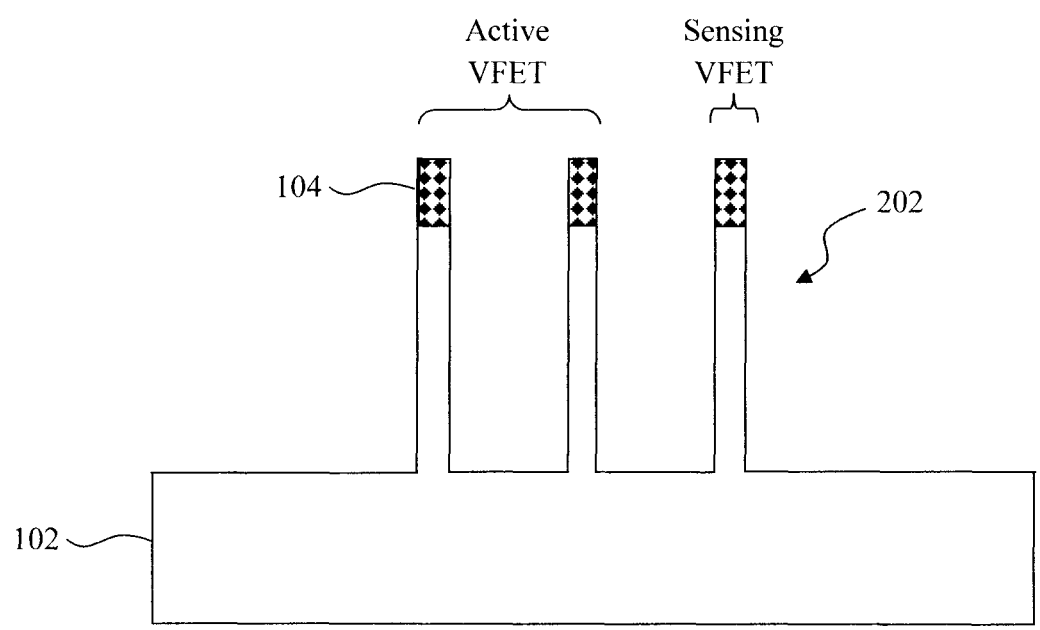
FIG. 2 is a cross-sectional diagram illustrating the fin hardmasks having been used to pattern fins in the substrate, whereby one or more of the fins will serve as the vertical fin channels of an active VFET device and another one or more of the fins will serve as the vertical fin channels of a sensing VFET device according to an embodiment of the present invention.

As show in FIG. 2, the fin hardmasks 104 are then used to etch fins 202 in the substrate 102. An anisotropic etching process such as reactive ion etching (RIE) can be employed for the fin etch. As shown in FIG. 2, the fins 202 extend only partway through the substrate 102.

As will become apparent from the description that follows, at least a first one of the fins 202 will serve as the vertical fin channels of an active VFET device, and at least a second one of the fins 202 will serve as the vertical fin channels of a sensing VFET device. For instance, in the example depicted in the figures, the left two fins 202 will serve as the vertical fin channels of the active VFET device, and the right fin 202 will serve as the vertical fin channel of the sensing VFET device.

Bottom source and drains 302 is then formed at the base of the fins 202. See FIG. 3. According to an exemplary embodiment, the bottom source and drains 302 are formed from a doped epitaxial material that is grown on the substrate 102 at the base of the fins 202 and in between the fins 202. Suitable epitaxial materials for the bottom source and drains 302 include, but are not limited to, epitaxial Si, epitaxial Ge and/or epitaxial SiGe that is in-situ doped (i.e., during growth) or ex-situ doped (e.g., via a process such ion implantation) with a p-type or n-type dopant. Suitable n-type dopants include, but are not limited to, phosphorous (P) and/or arsenic (As), and suitable p-type dopants include, but are not limited to, boron (B).

Figure 3:
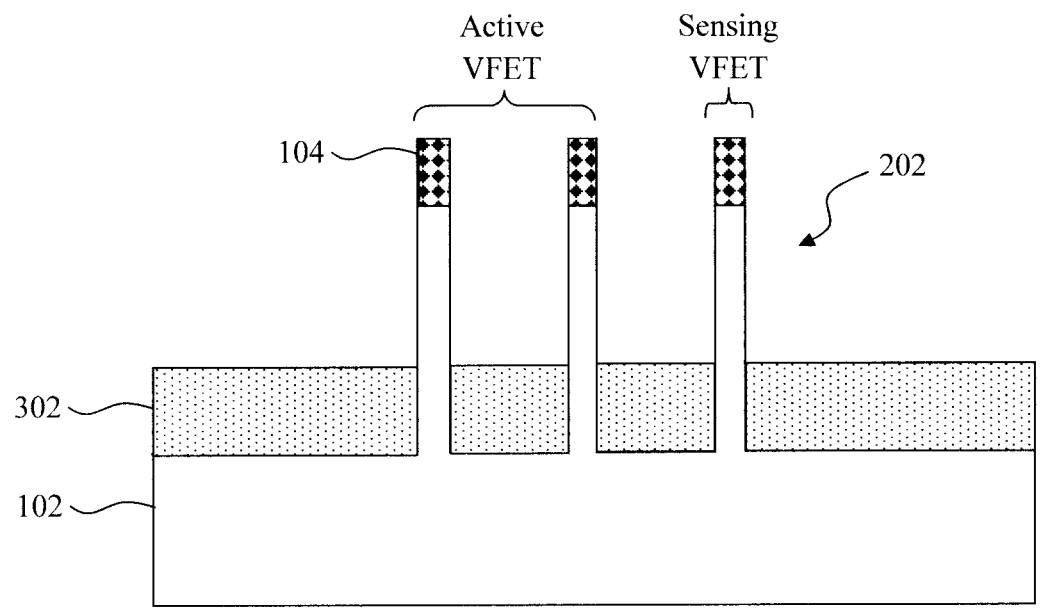
FIG. 3 is a cross-sectional diagram illustrating bottom source and drains having been formed at a base of the fins according to an embodiment of the present invention.
Figure 3A:
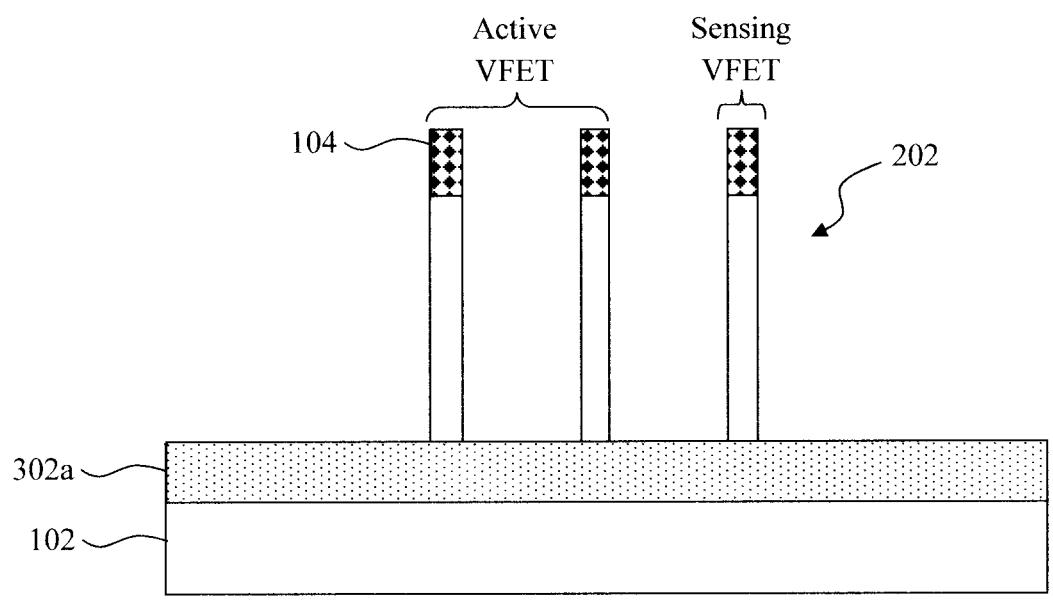
FIG. 3A is a cross-sectional diagram illustrating, according to an alternative embodiment, bottom source and drains having been formed using ion implantation into the substrate, beneath the fins according to an embodiment of the present invention.
Figure 4:
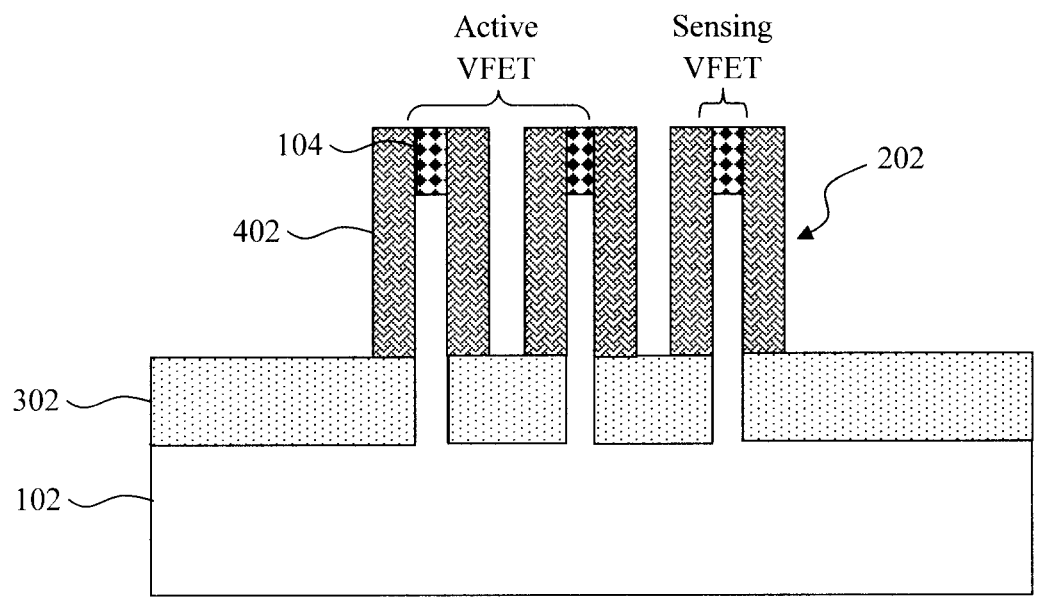
FIG. 4 is a cross-sectional diagram illustrating sacrificial spacers having been formed along the sidewalls of the fins according to an embodiment of the present invention.

Alternatively, the bottom source and drains can be formed using ion implantation into the substrate 102, beneath the fins 202. See, for example FIG. 3A, wherein bottom source and drains 302a have been formed in the substrate 102 beneath the fins 202 using ion implantation. As provided above, suitable n-type dopants include phosphorous (P) and/or arsenic (As), and suitable p-type dopants include, but are not limited to, boron (B). For ease and clarity of depiction, the process flow will continue from the exemplary embodiment shown in FIG. 3 with the understanding that bottom source and drain regions could instead be formed via ion implantation as shown in FIG. 3A.

As highlighted above, isolation is needed between the fins 202 in the active and sensing VFET devices. To begin the isolation process, sacrificial spacers 402 are first formed along the sidewalls of the fins 202. See FIG. 4. According to an exemplary embodiment, sacrificial spacers 402 are formed by conformally depositing a spacer material onto the fins 202 and then using an anisotropic etching process (such as RIE) to pattern the spacer material into the individual sacrificial spacers 402. Suitable spacer materials include, but are not limited to, oxide spacer materials such as silicon dioxide ($SiO_2$).

Figure 5:
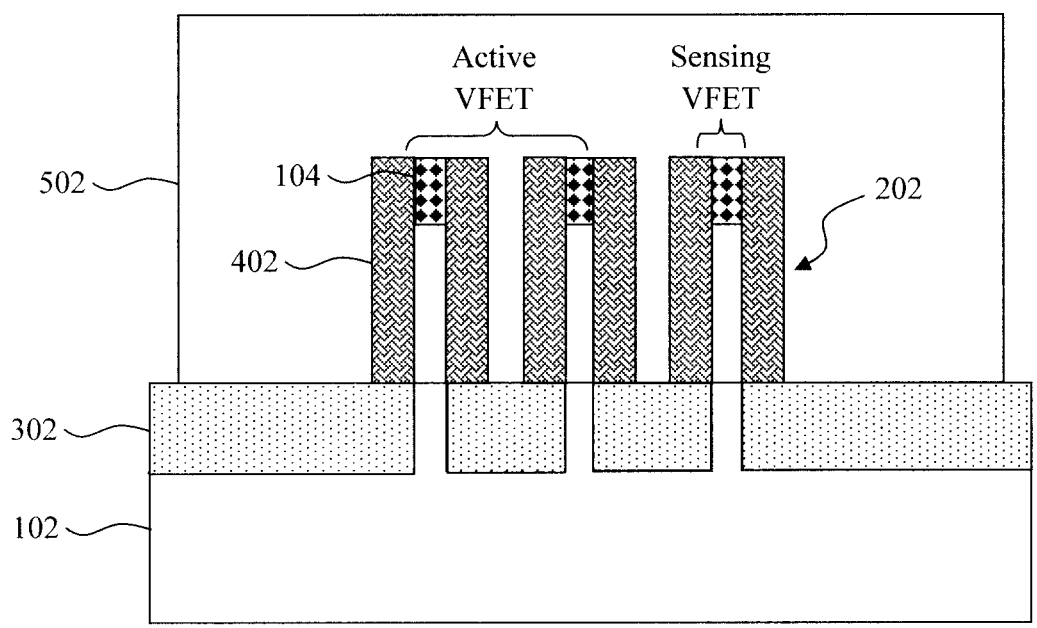
FIG. 5 is a cross-sectional diagram illustrating the fins having been buried in a gap fill dielectric according to an embodiment of the present invention.

The fins 202 are then buried in a gap fill dielectric 502. See FIG. 5. As shown in FIG. 5, the gap fill dielectric 502 fills in the spaces between the fins 202. According to an exemplary embodiment, the gap fill dielectric 502 is an organic planarizing (OPL) material such as an aromatic cross-linkable polymer (e.g., naphthalene-based). Other suitable organic planarizing materials are described, for example, in U.S. Pat. No. 7,037,994 issued to Sugita et al. entitled "Acenaphthylene Derivative, Polymer, and Antireflection Film-Forming Composition," U.S. Pat. No. 7,244,549 issued to Iwasawa et al. entitled "Pattern Forming Method and Bilayer Film," U.S. Pat. No. 7,303,855 issued to Hatakeyama et al. entitled "Photoresist Undercoat-Forming Material and Patterning Process" and U.S. Pat. No. 7,358,025 issued to Hatakeyama entitled "Photoresist Undercoat-Forming Material and Patterning Process," the contents of each of which are incorporated by reference as if fully set forth herein.

Figure 6:
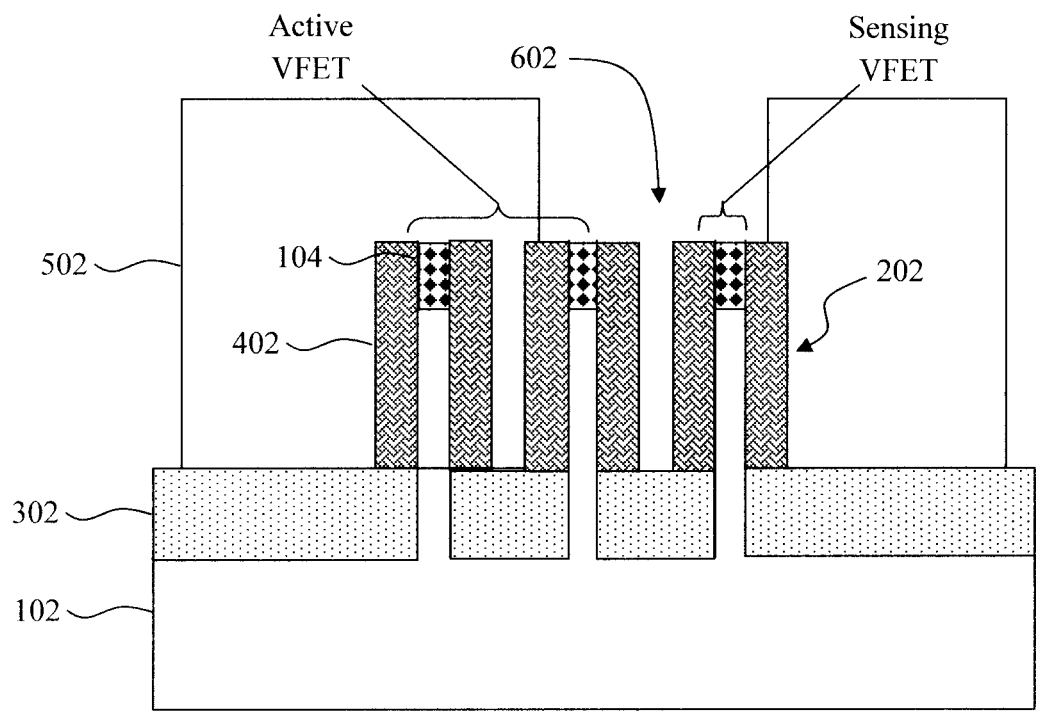
FIG. 6 is a cross-sectional diagram illustrating a trench having been patterned in the gap fill dielectric between the active VFET fins and the sensing VFET fin, whereby the trench extends through the gap fill dielectric down to the bottom source and drains according to an embodiment of the present invention.

Standard lithography and etching techniques are then used to pattern a trench 602 in the gap fill dielectric 502 between the active VFET fins 202 and the sensing VFET fin 202. See FIG. 6. As shown in FIG. 6, the trench 602 extends through the gap fill dielectric 502 down to the bottom source and drains 302.

Figure 7:
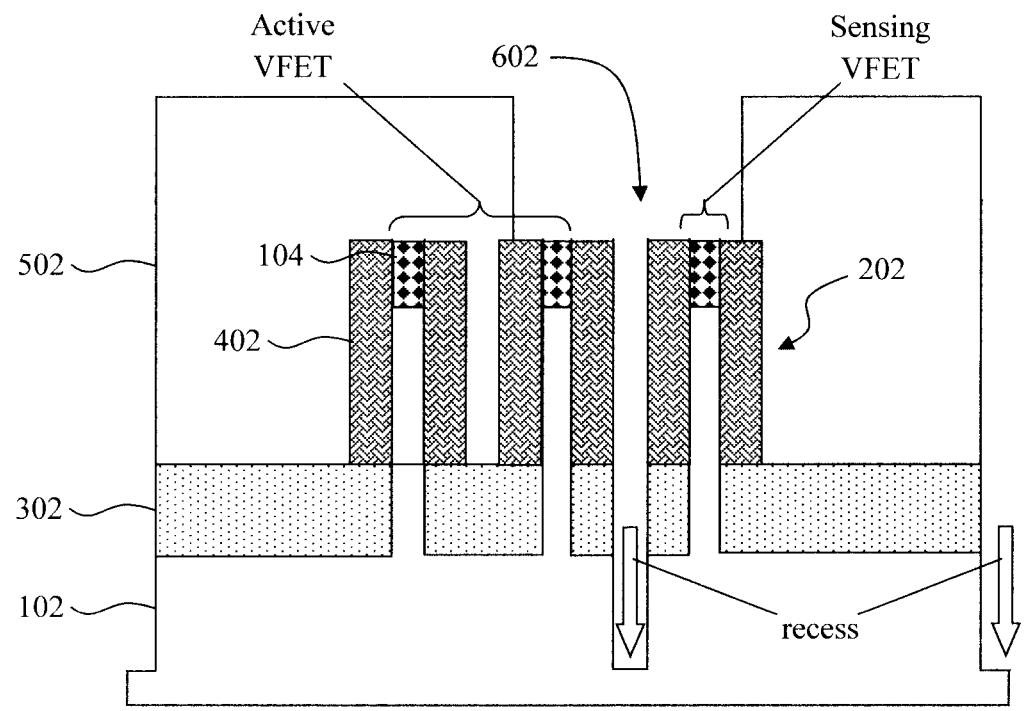
FIG. 7 is a cross-sectional diagram illustrating an etch having been used to extend the trench through the bottom source and drains and into the underlying substrate according to an embodiment of the present invention.
Figure 8:
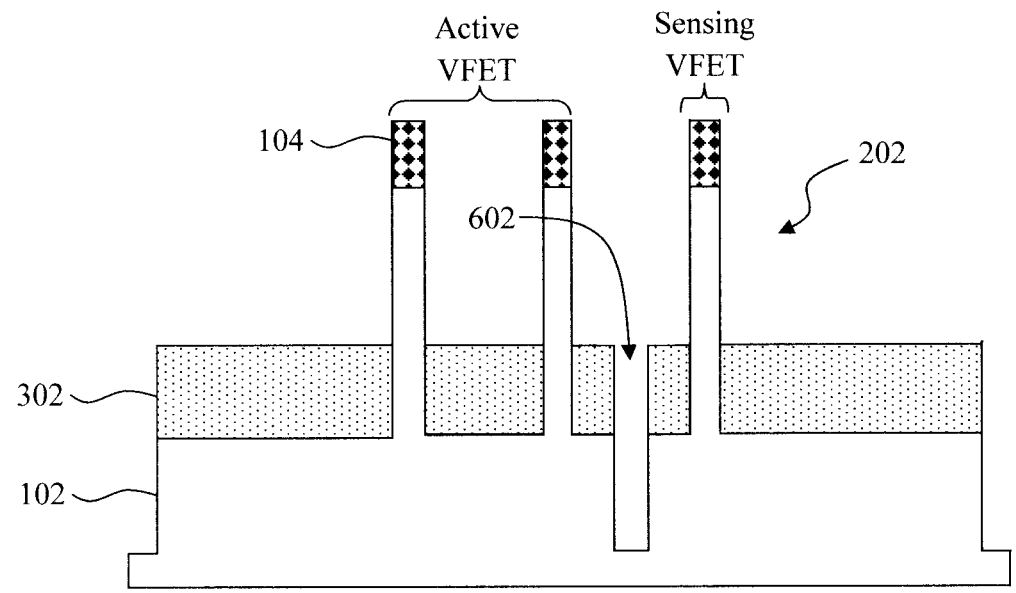
FIG. 8 is a cross-sectional diagram illustrating the gap fill dielectric and the sacrificial spacers having been removed according to an embodiment of the present invention.
Figure 9:
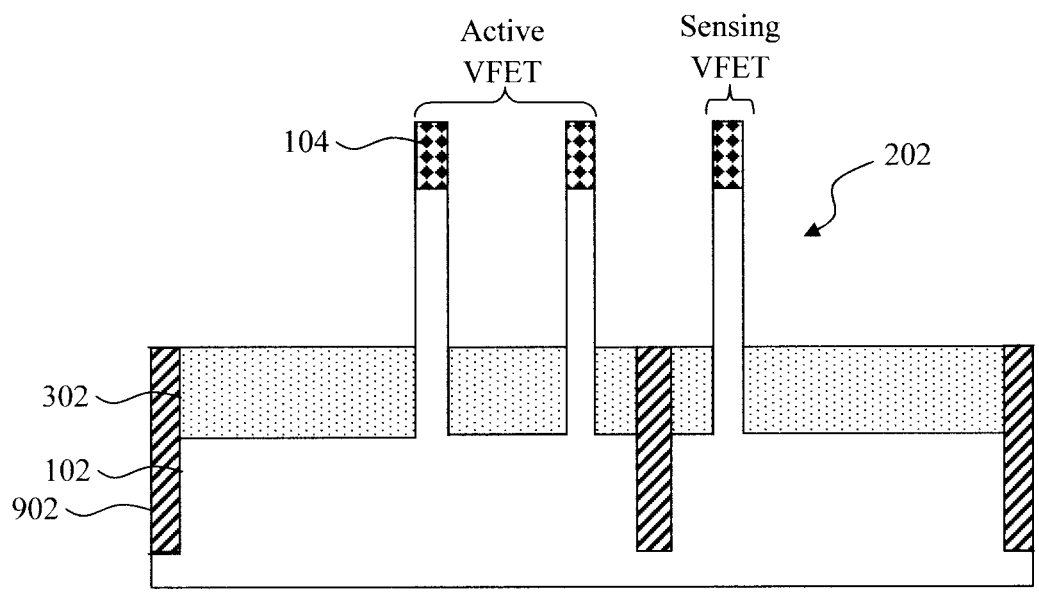
FIG. 9 is a cross-sectional diagram illustrating the trench having been filled with an insulator, forming shallow trench isolation (STI) regions in between the fins of the active VFET devices and those of the sensing VFET device according to an embodiment of the present invention.

However, as provided above, the goal is to isolate the bottom source and drains 302 of the active VFET devices from that of the sensing VFET device. Thus, as shown in FIG. 7 an etch is used to extend the trench 602 through the bottom source and drains 302 and into the underlying substrate 102. This trench recess etch can be performed using a RIE or combination of RIE steps (with the patterned gap fill dielectric 502 and the sacrificial spacers 402 as a mask) to pattern the trench 602 (between the sacrificial spacers 402) through the bottom source and drains 302 and the substrate 102. As a result, the unmasked portions (i.e., to either side of the fins 202) may also be recessed. See FIG. 7.

Following the recess etch through the bottom source and drains 302 between the active and sensing VFET devices, the gap fill dielectric 502 is removed as are the sacrificial spacers 402. See FIG. 8.

The recesses, including trench 602 are then filled with an insulator, forming shallow trench isolation (STI) regions 902 in between the fins 202 of the active VFET devices and those of the sensing VFET device. See FIG. 9. Excess insulator can be removed using a process such as CMP. Suitable insulators for STI regions 902 include, but are not limited to, oxides such as $SiO_2$, which may be also referred to herein as an STI oxide. The result is two isolated sets of fins 202, in this case the fins on the left that will serve as the vertical fin channels of the active VFET devices and the fins 202 on the right that will serve as the vertical fin channels of the sensing VFET device.

To form functioning VFET devices, a gate will be formed around the fins 202 (i.e., the vertical fin channels), and top source and drains will be formed over the gate at the tops of the fins 202. Bottom and top spacers will be formed separating the gate from the bottom and top source and drains, respectively.

Figure 10:
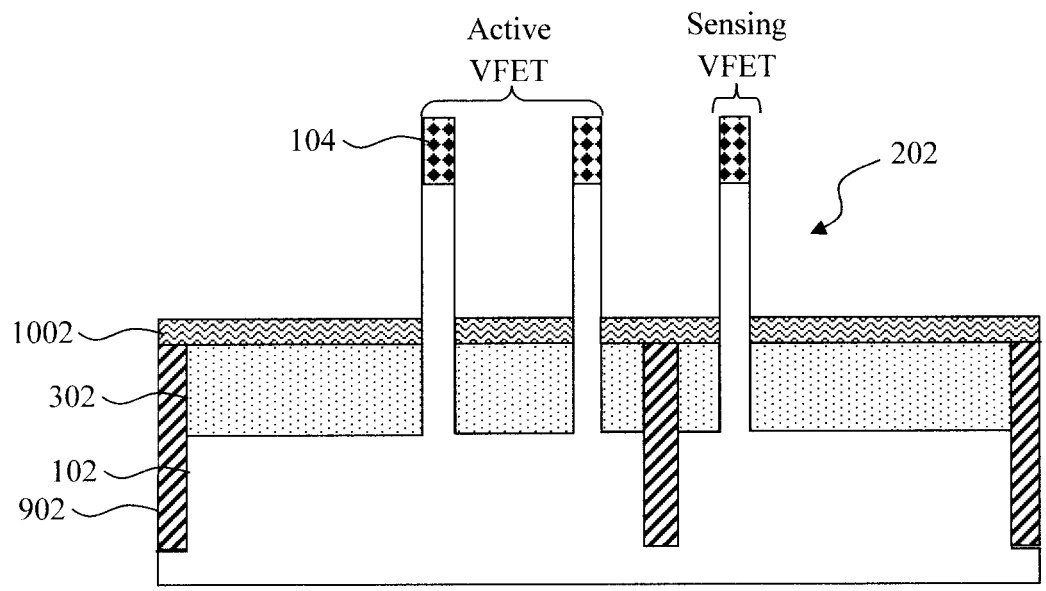
FIG. 10 is a cross-sectional diagram illustrating bottom spacers having been formed on the bottom source and drains, in between the fins according to an embodiment of the present invention.

Namely, as shown in FIG. 10 bottom spacers 1002 are formed on the bottom source and drains 302, in between the fins 202. According to an exemplary embodiment, the bottom spacers 1002 are formed using a directional deposition process whereby a spacer material is deposited onto the bottom source and drains 302 and fins 202 with a greater amount of the material being deposited on the horizontal surfaces, as compared to the vertical surfaces. To use an illustrative example, a greater thickness of the spacer material will be deposited on top of the bottom source and drains 302 in between the fins 202 than along the sidewalls of the fins 202. Thus, when an etch is used on the spacer material, the timing of the etch needed to remove the spacer material from the vertical surfaces will leave the bottom spacers 1002 shown in FIG. 10 on top of bottom source and drains 302 since a greater amount of the spacer material was present on the bottom source and drains 302 to begin with.

By way of example only, a high-density plasma (HDP) chemical vapor deposition (CVD) or physical vapor deposition (PVD) process can be used for directional film deposition, and an isotropic etch can be used to remove the (thinner) spacer material deposited onto the vertical surfaces. Suitable materials for the bottom spacers 1002 include, but are not limited to, oxide spacer materials such as silicon dioxide ($SiO_2$) and/or silicon carbon oxide (SiCO), and nitride spacer materials such as silicon nitride (SiN), silicon boron carbon nitride (SiBCN), silicon oxycarbon nitride (SiOCN), and/or silicon carbon nitride (SiCN).

The gate is next formed around the fins 202 (vertical fin channels) above the bottom spacers 1002. According to an exemplary embodiment, the gate includes a conformal gate dielectric 1102 that is deposited onto the fins 202, and a conformal gate conductor 1104 that is deposited onto the gate dielectric 1102. See FIG. 11. In one exemplary embodiment, the conformal gate conductor 1104 is a workfunction-setting metal, and the conformal gate dielectric 1102 is a high-K gate dielectric.

The particular workfunction-setting metal employed can vary depending on whether an n-type or p-type transistor is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction metal stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for hafnium oxide ($HfO_2$) rather than 4 for silicon dioxide). Suitable high-K gate dielectrics include, but are not limited to, $HfO_2$ and/or lanthanum oxide ($La_2O_3$).

Figure 11:
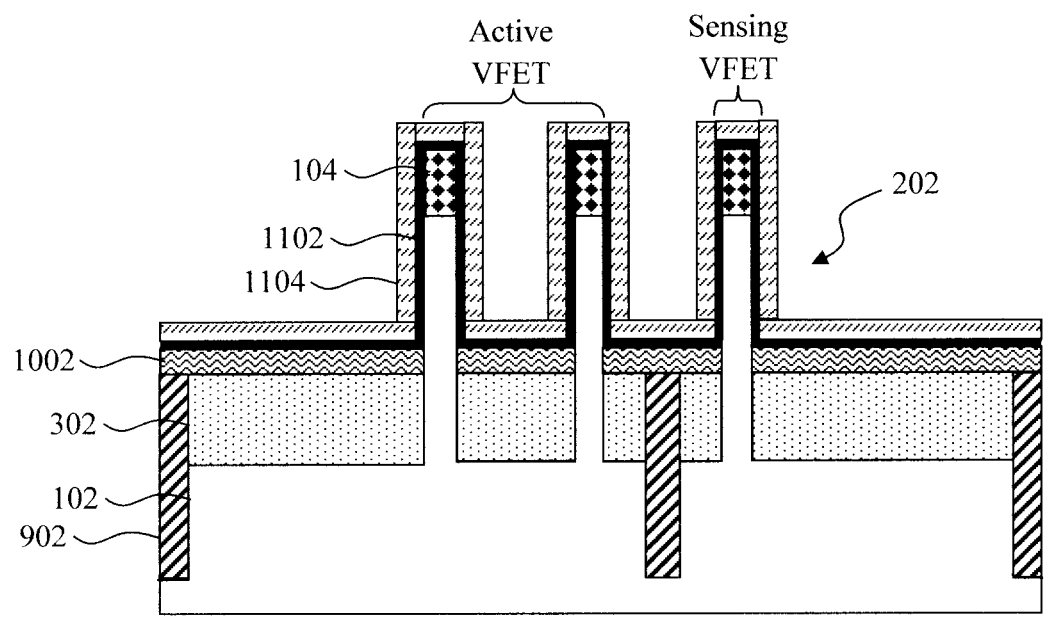
FIG. 11 is a cross-sectional diagram illustrating a gate (including a gate dielectric and a gate conductor) having been formed around the fins (vertical fin channels) above the bottom spacers according to an embodiment of the present invention.
Figure 11A:
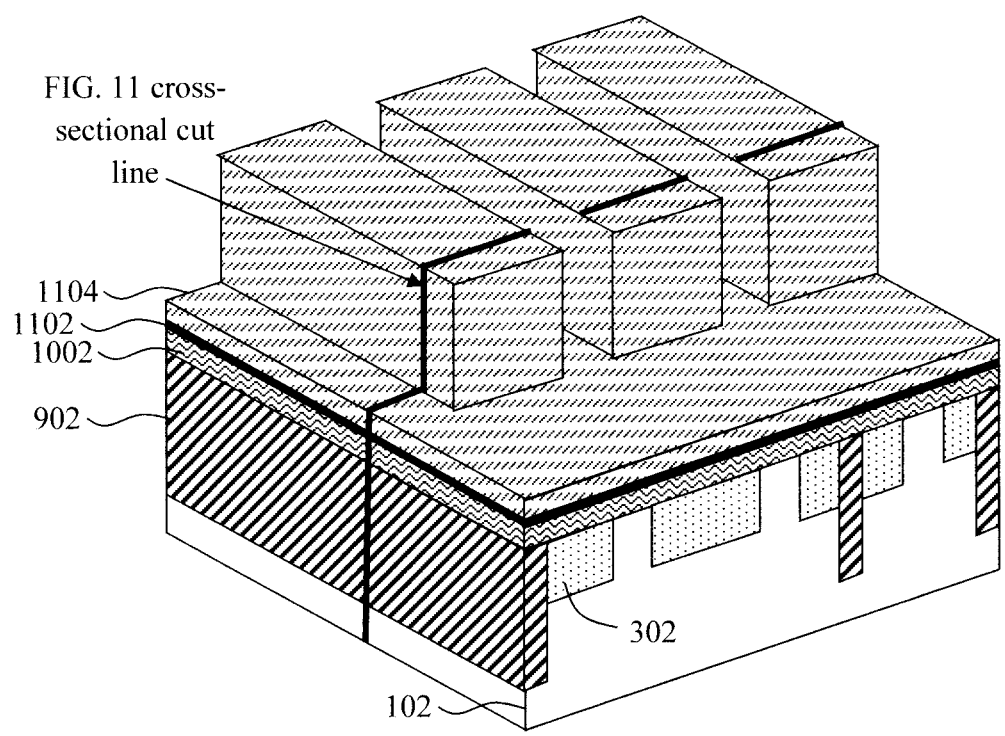
FIG. 11A is three dimensional diagram illustrating the gate (i.e., gate dielectric and gate conductor) having been formed around the fins (vertical fin channels) above the bottom spacers according to an embodiment of the present invention.
Figure 11B:
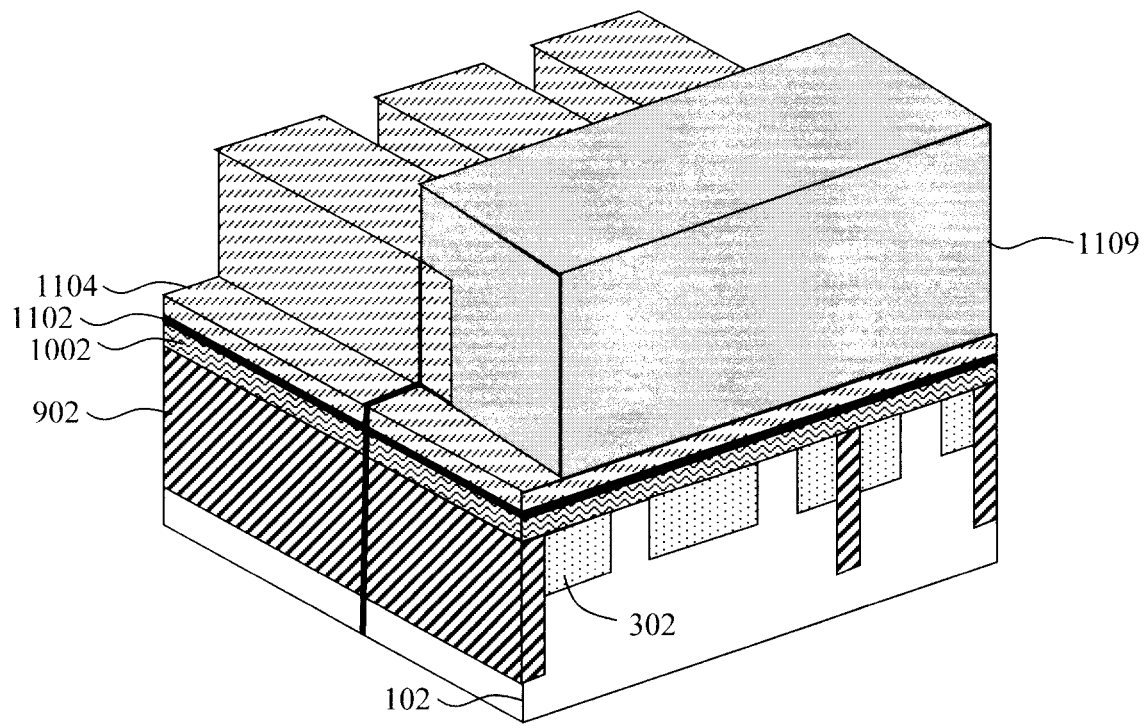
FIG. 11B is three dimensional diagram illustrating a block mask having been formed over/masking a portion of the gate at the end of the fins according to an embodiment of the present invention.

Reference will now shift briefly to three-dimensional depictions of the test structure to illustrate processing now performed at the end of the fins which enables a common gate contact to be formed (see FIG. 23, described below). See, for example, FIG. 11A. For reference, the orientation of the cross-sectional cut of FIG. 11 is labeled in FIG. 11A. As shown in FIG. 11A, the conformal gate dielectric 1102 and conformal gate conductor 1104 have been deposited over the fins 202 as described in conjunction with the description of FIG. 11, above. Next, as shown in FIG. 11B a block mask 1109 is then formed over/masking a portion of the gate at the end of the fins. This block mask 1109 will prevent removal of the gate dielectric 1102 and gate conductor 1104 from this region during the gate recess which is performed next.

Figure 12:
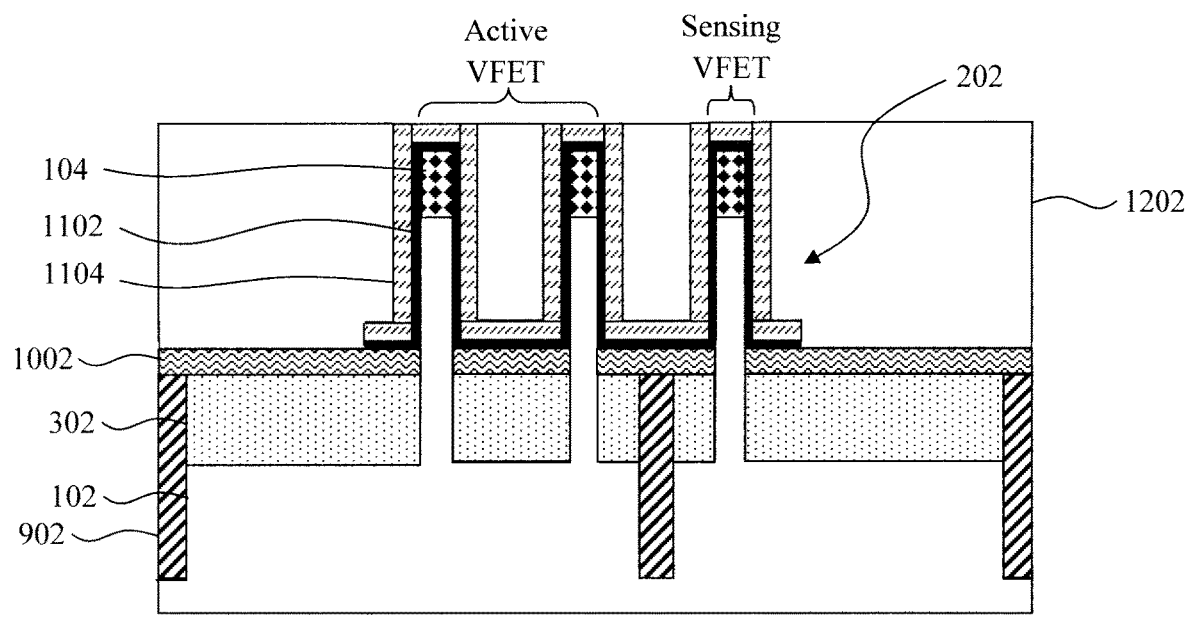
FIG. 12 is a cross-sectional diagram illustrating the fins, the gate dielectric and gate conductor having been buried in a gap fill dielectric according to an embodiment of the present invention.
Figure 13:
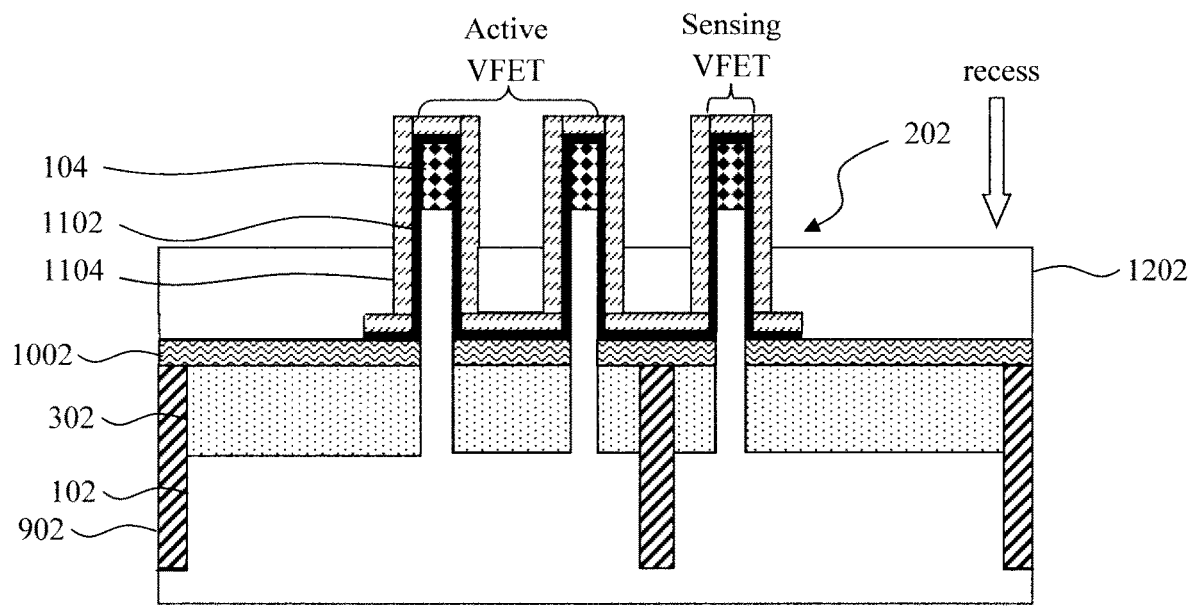
FIG. 13 is a cross-sectional diagram illustrating gap fill dielectric having been recessed such that the top surface of the gap fill dielectric is below the tops of the fins according to an embodiment of the present invention.
Figure 14:
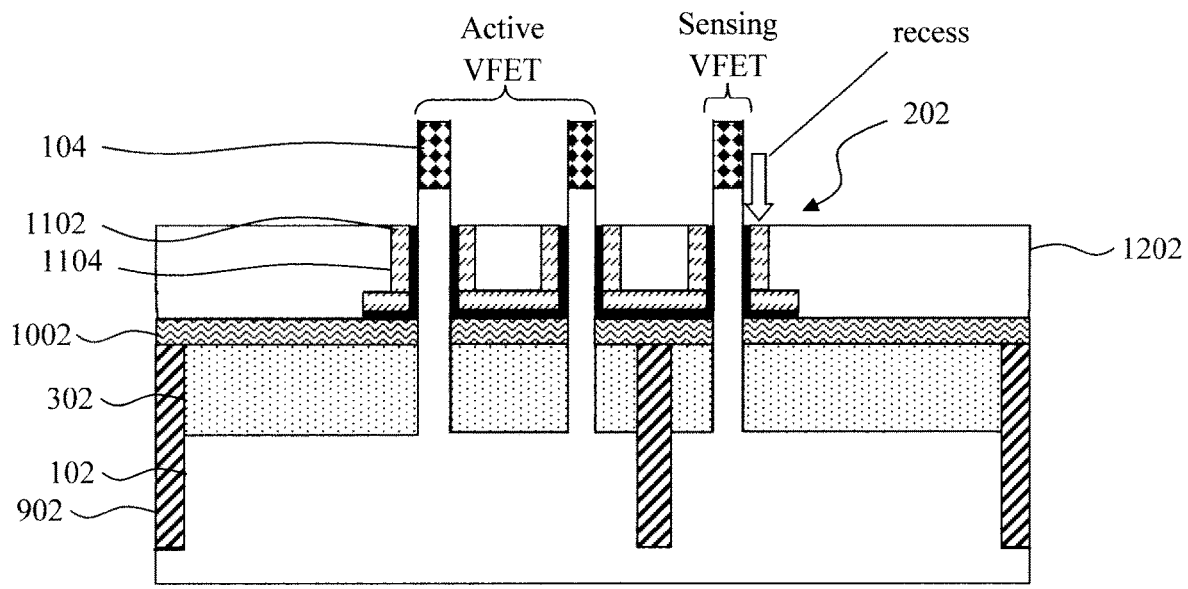
FIG. 14 is a cross-sectional diagram illustrating the gate dielectric and the gate conductor having been recessed to the level of the (recessed) gap fill dielectric according to an embodiment of the present invention.

Namely, the gate dielectric 1102 and gate conductor 1104 at present encapsulate the fins 202. However, in order to access the tops of the fins 202 for forming the top source and drains, the gate dielectric 1102 and gate conductor 1104 have to next be recessed at the tops of the fins 202. To do so, fins 202, the gate dielectric 1102 and gate conductor 1104 are then buried in a gap fill dielectric 1202 such as an OPL. See FIG. 12 which is once again a cross-sectional view of the structure. As shown in FIG. 12, the gate region has also been patterned to cut off the gate dielectric 1102 and gate conductor 1104 from two sides of the fins. Suitable OPL materials were provided above. As shown in FIG. 12, gap fill dielectric 1202 fills in the spaces between the fins 202. After deposition, the gap fill dielectric 1202 is polished down to the fin hardmasks 104 using a process such as chemical mechanical polishing (CMP).

Use of gap fill dielectric 1202 enables selective exposure of tops of the fins 202. For instance, the gap fill dielectric 1202 is next recessed such that the top surface of the gap fill dielectric 1202 is below the tops of the fins 202. See FIG. 13. This recess of the gap fill dielectric 1202 sets the depth for the recess of the gate dielectric 1102 and gate conductor 1104.

Namely, the gate dielectric 1102 and gate conductor 1104 are next recessed to the level of the (recessed) gap fill dielectric 1202. See FIG. 14. The tops of the fins 202 are now exposed. Following recess of the gate dielectric 1102 and gate conductor 1104, the remaining gap fill dielectric 1202 is removed. See FIG. 15.

Figure 15:
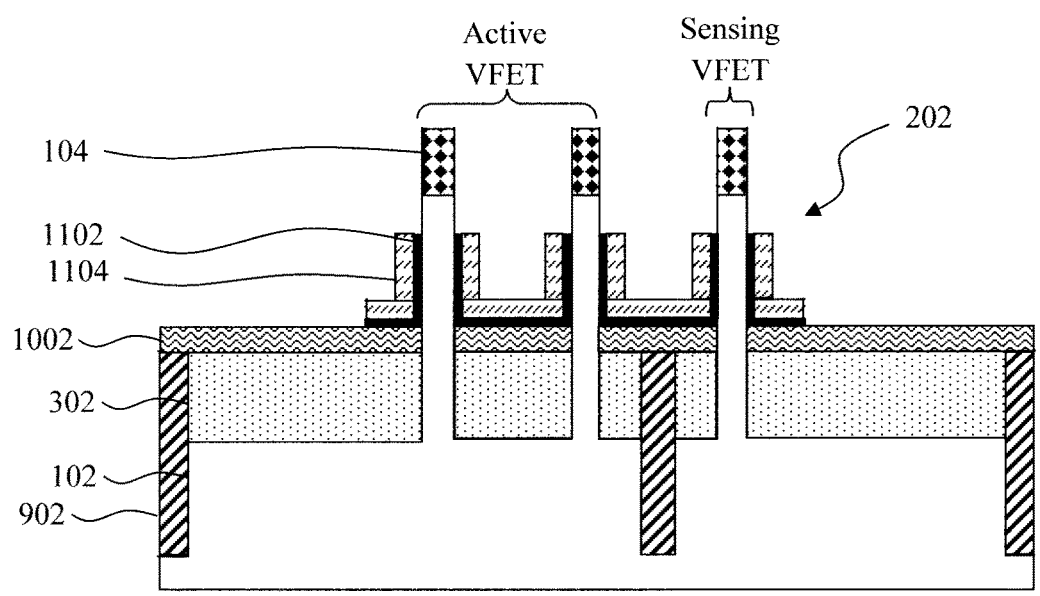
FIG. 15 is a cross-sectional diagram illustrating the gap fill dielectric having been removed according to an embodiment of the present invention.
Figure 15A:
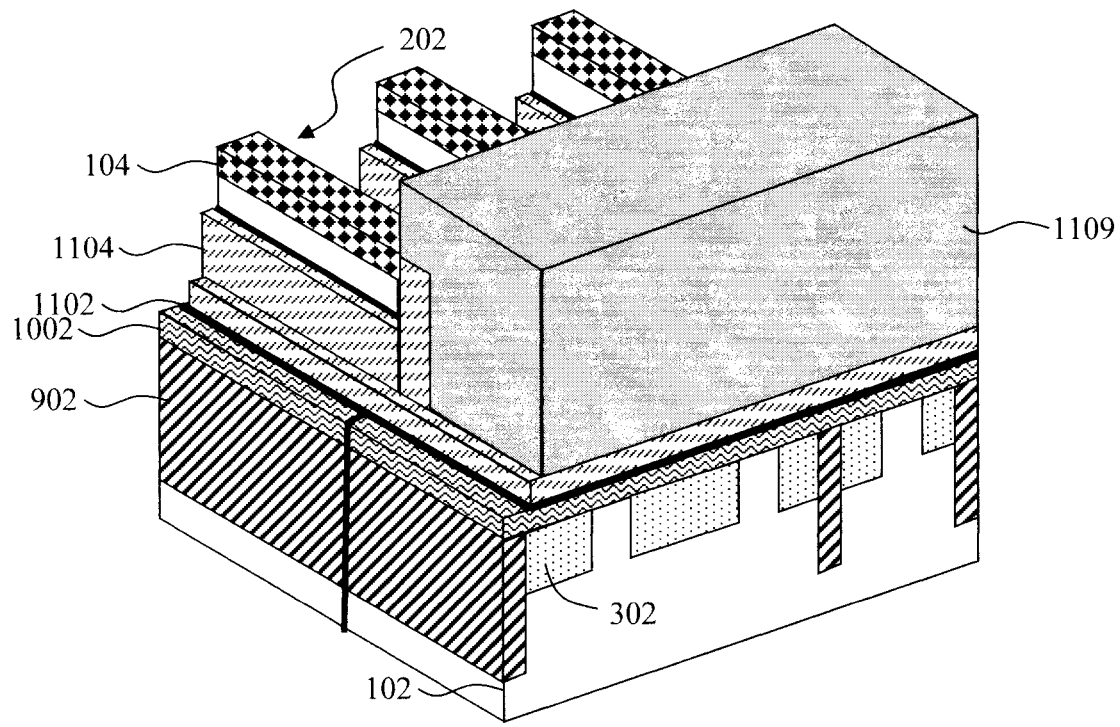
FIG. 15A is a three-dimensional diagram illustrating how recess of the gate dielectric and gate conductor is prevented at the end of the fins by the block mask according to an embodiment of the present invention.
Figure 15B:
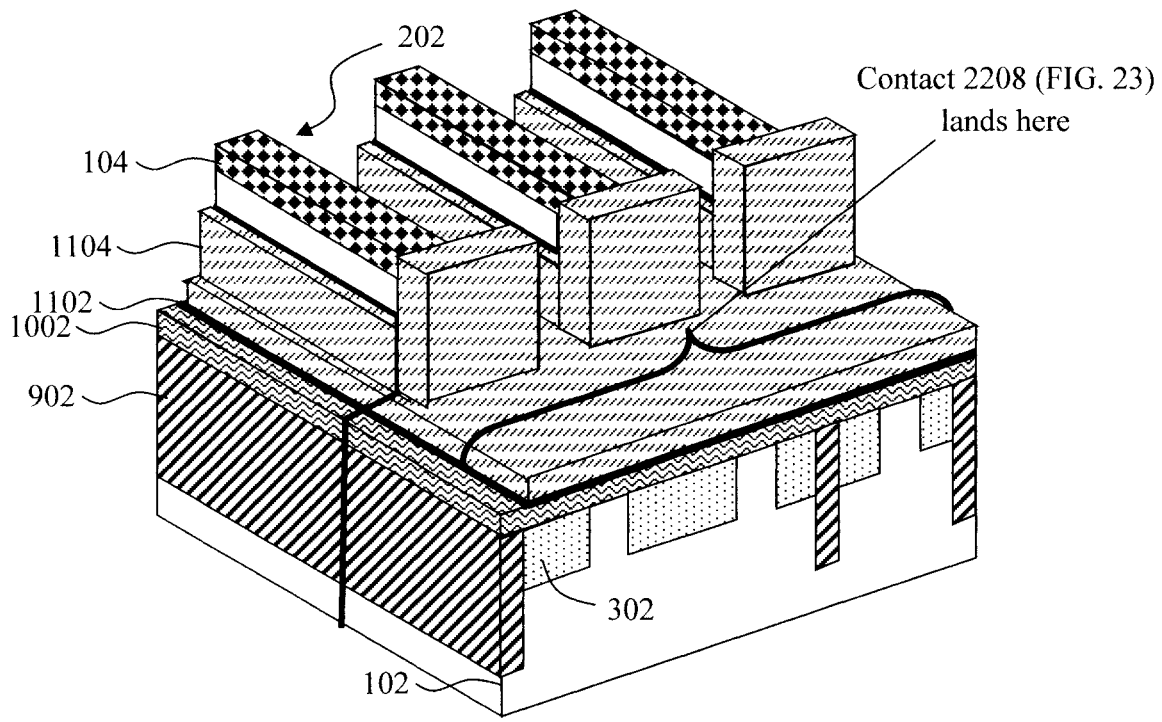
FIG. 15B is a three-dimensional diagram illustrating the block mask having been removed revealing that the gate dielectric and gate conductor are intact at the ends of the fins according to an embodiment of the present invention.

Recess of the gate dielectric 1102 and gate conductor 1104, however, is prevented at the end of the fins 202 covered by the block 1109. See, for example, FIG. 15A which provides a three-dimensional representation of the test structure following gate recess. As shown in FIG. 15A, with the block mask 1109 in place the gate dielectric 1102 and gate conductor 1104 (under the block mask 1109) remains intact at the ends of the fins 202. Thus, when the block mask 1109 is removed as shown in FIG. 15B, the gate conductor 1104 is present at the ends of the fins 202. As will be described in conjunction with the description of FIG. 23 below, a gate contact 2208 will be formed that is common to all of the devices. FIG. 15B shows where this common gate contact lands.

Figure 16:
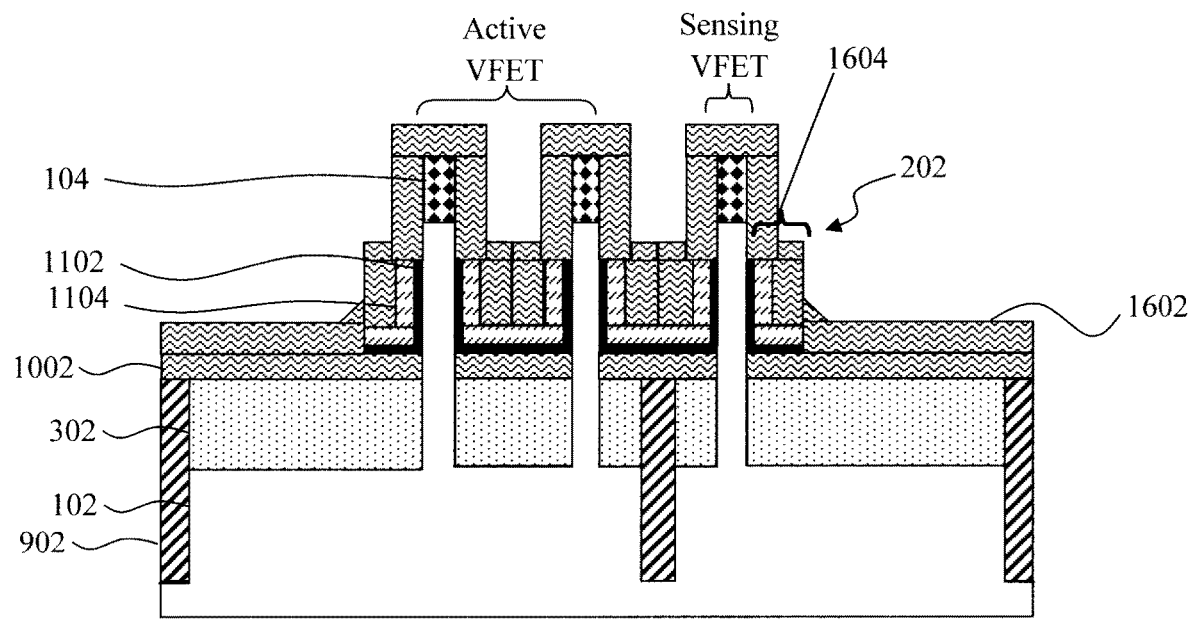
FIG. 16 is a cross-sectional diagram illustrating a conformal encapsulation layer having been formed on the fins and gate conductor which provides top spacers over the gate according to an embodiment of the present invention.
Figure 17:
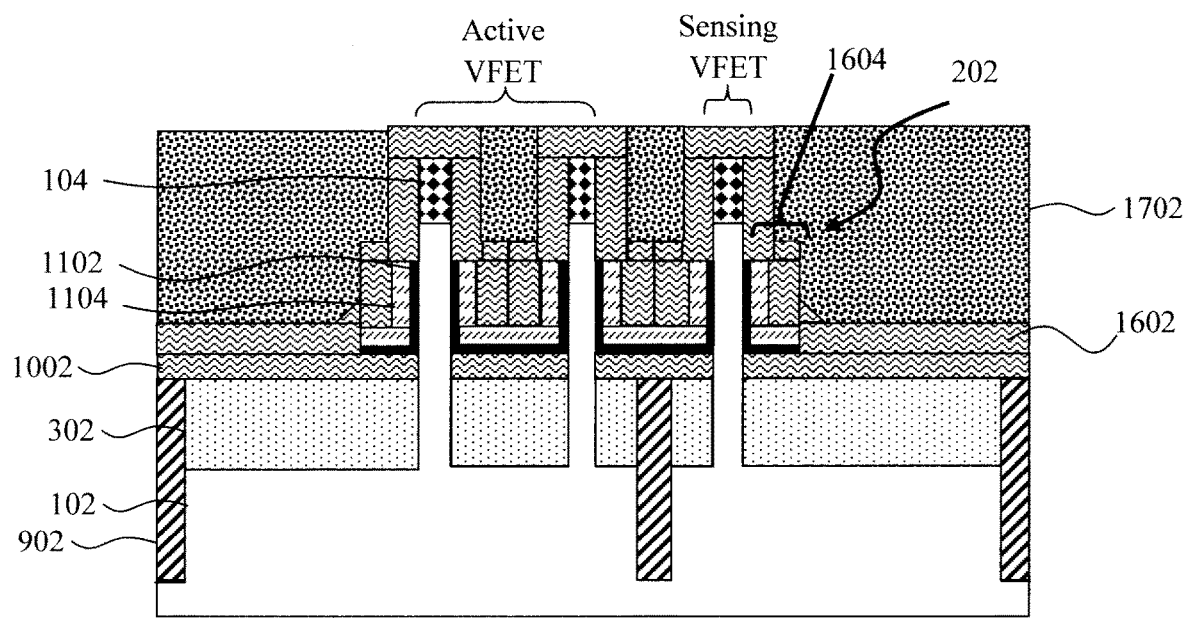
FIG. 17 is a cross-sectional diagram illustrating an interlayer dielectric (ILD) having been blanket deposited over the encapsulation layer, filling the spaces in between the fins according to an embodiment of the present invention.

As provided above, counterpart top spacers are needed above the gate, separating the gate from the top source and drains. To form the top spacers, a conformal encapsulation layer 1602 is formed on the fins 202 and gate conductor 1104. See FIG. 16. As shown in FIG. 16, formation of the encapsulation layer 1602 provides top spacers 1604 over the gate. The top spacers 1604 and the counterpart bottom spacers 1002 serve to offset the gate from the top and bottom source and drains, respectively.

Suitable materials for the encapsulation layer 1602 include, but are not limited to, nitride materials such as silicon nitride (SiN) and/or silicon-boron-carbon-nitride (SiBCN). According to an exemplary embodiment, the encapsulation layer 1602 and the bottom spacers 1002 are both formed from the same material such that the top spacers 1604 and the bottom spacers 1002 are both formed from the same material, e.g., SiN or SiBCN.

Figure 18:
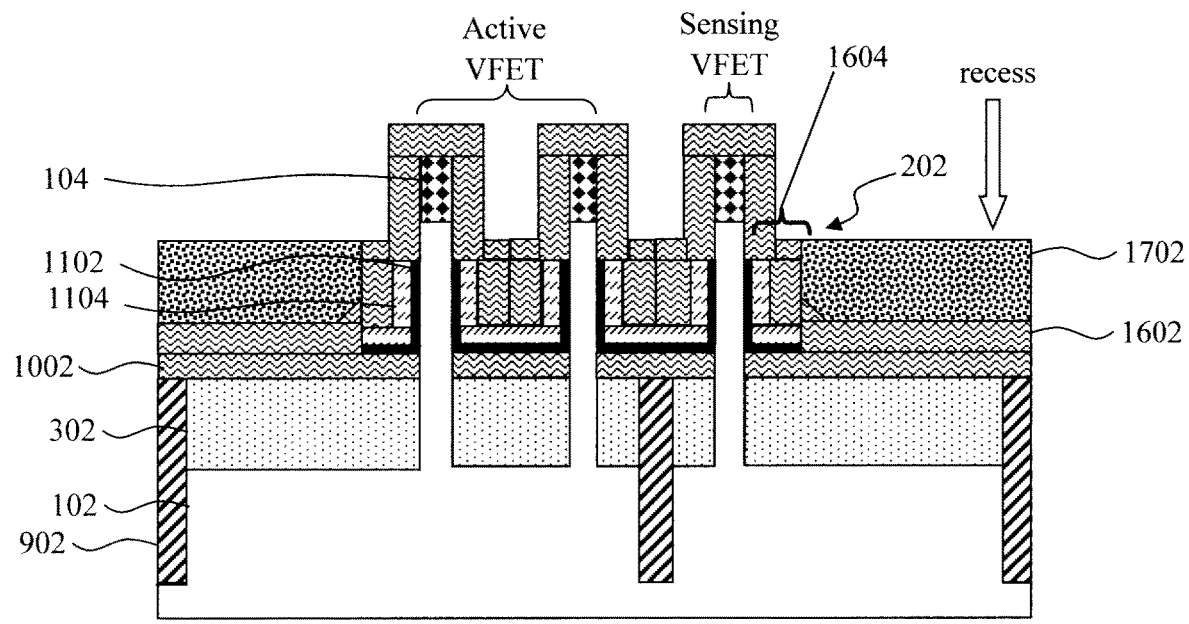
FIG. 18 is a cross-sectional diagram illustrating the ILD having been recessed such that the top surface of the ILD is beneath the tops of the fins according to an embodiment of the present invention.
Figure 19:
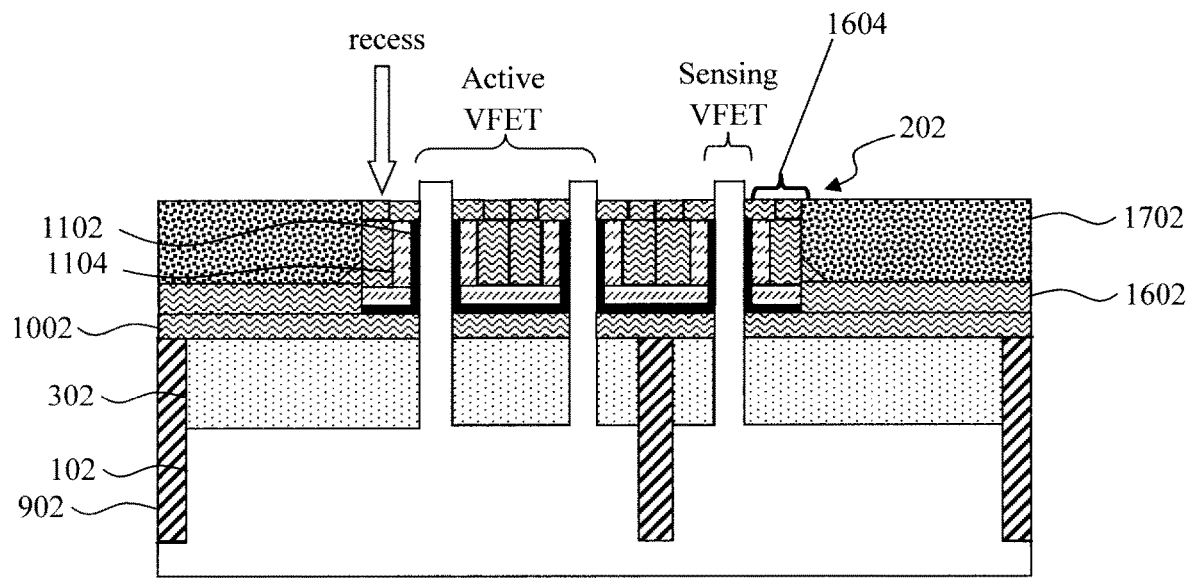
FIG. 19 is a cross-sectional diagram illustrating the encapsulation layer and the fin hardmasks having been removed at the tops of the fins according to an embodiment of the present invention.

An interlayer dielectric (ILD) 1702 is then blanket deposited over the encapsulation layer 1602, filling the spaces in between the fins 202. See FIG. 17. Suitable ILD materials include, but are not limited to, $SiO_2$. Use of an ILD 1702 enables selective removal of the fin hardmasks 104 and encapsulation layer 1602 at the tops of the fins 202. Namely, as shown in FIG. 18, the ILD 1702 is next recessed such that the top surface of the ILD 1702 is beneath the tops of the fins 202. See FIG. 18.

An etch is then used to remove the encapsulation layer 1602 and the fin hardmasks 104 at the tops of the fins 202. See FIG. 19. This recess etch reveals the tops of the fins 202 to enable formation of the top source and drain. As provided above, the fins hardmasks 104 and the encapsulation layer 1602 can both be formed from a nitride material. In that case, a nitride-selective etching process, such as a nitride-selective RIE can be employed to recess the encapsulation layer 1602 (i.e., down to the ILD 1702) and remove the fin hardmasks 104. It is notable that, following the recess etch of the encapsulation layer 1602, the top spacers 1604 remain present over the gate.

Figure 20:
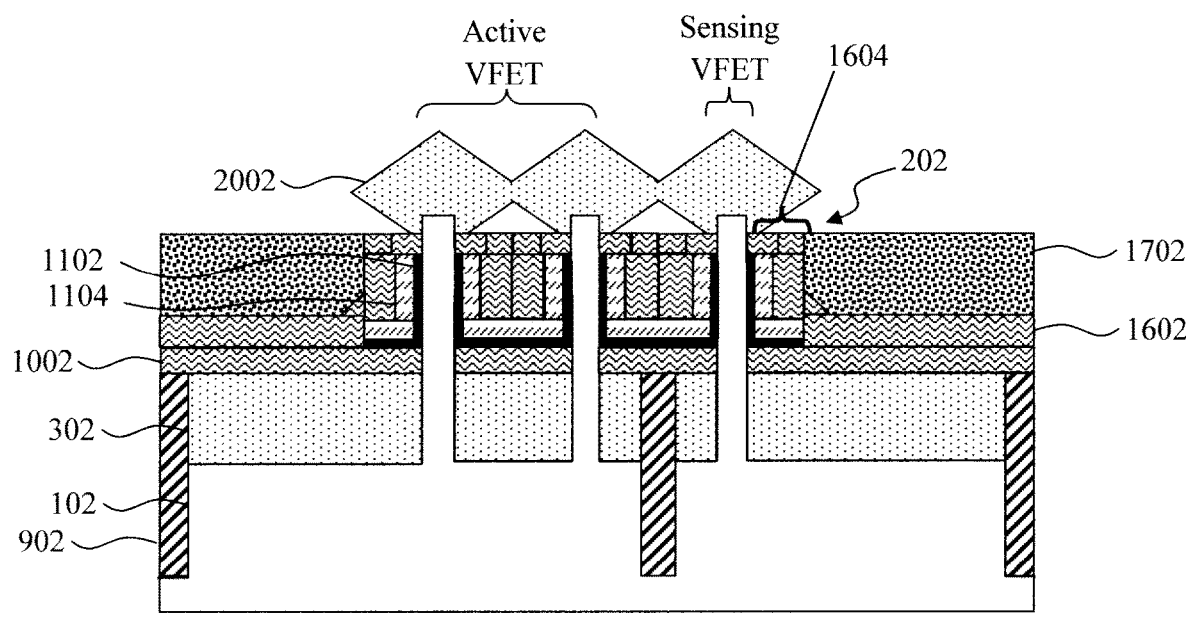
FIG. 20 is a cross-sectional diagram illustrating top source and drains having been formed on the (now exposed) tops of the fins 202 (vertical fin channels) according to an embodiment of the present invention.
Figure 21:
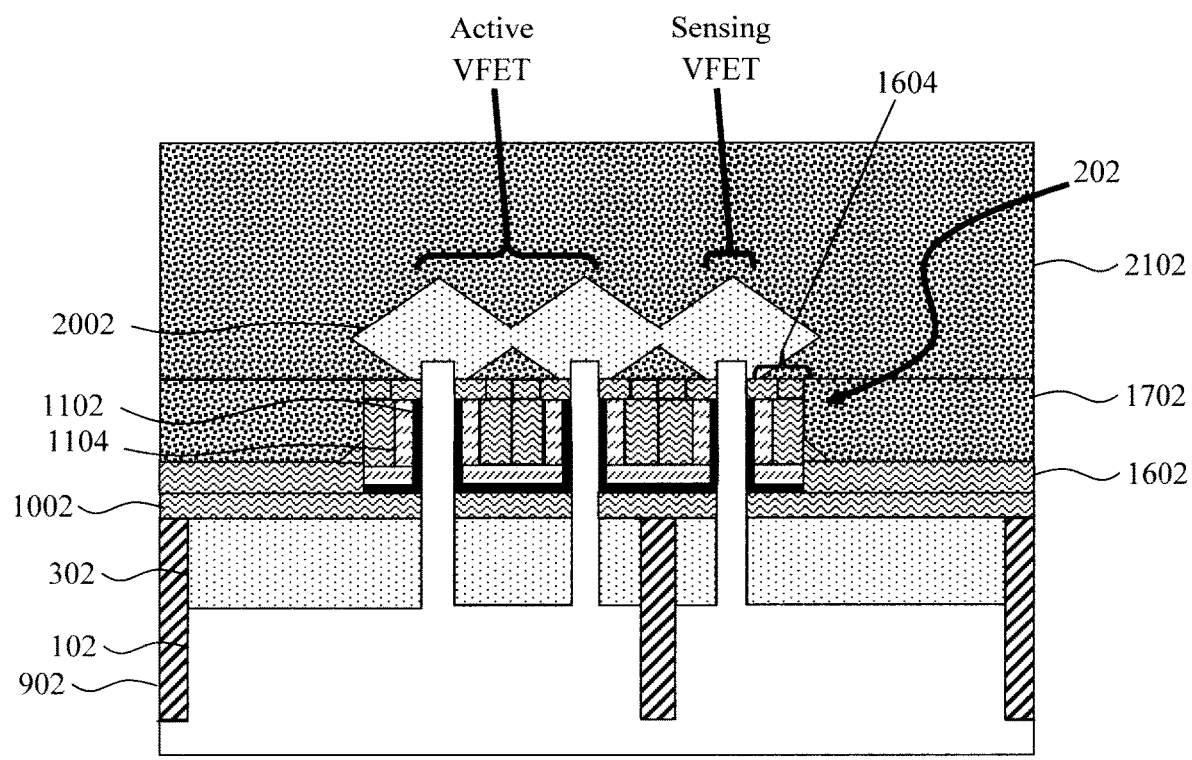
FIG. 21 is a cross-sectional diagram illustrating an ILD having been blanket deposited onto the device over/burying the top source and drains according to an embodiment of the present invention.

Top source and drains 2002 are then formed on the (now exposed) tops of the fins 202 (vertical fin channels). See FIG. 20. According to an exemplary embodiment, the top source and drains 2002 are formed from an in-situ (i.e., during growth) or ex-situ (e.g., via implantation) doped epitaxial material such as epitaxial Si, Ge, SiGe, etc. As provided above, suitable n-type dopants include, but are not limited to, phosphorous (P) and arsenic (As), and suitable p-type dopants include, but are not limited to, boron (B). As shown in FIG. 20, the top source and drains 2002 are merged between the fins 202. Thus, the top source and drains 2002 of the active VFET and the sensing VFET devices are tied together. However, as provided above, the bottom source and drains 302 of the active VFET devices are isolated from the bottom source and drains 302 of the sensing VFET device by the STI regions 902. Thus, as will be described in detail below, the sensing VFET device can sample/sense the current flowing through the active VFET devices (i.e., via the top source and drains 2002) but, due to the isolation in the bottom source and drains 302, no current will flow through the sensing VFET device itself.

Metallization is now needed to form the contacts which are the subject of the present contact resistance measurements. To do so, an ILD 2102 is blanket deposited onto the device over/burying the top source and drains 2002. See FIG. 21.

Figure 22:
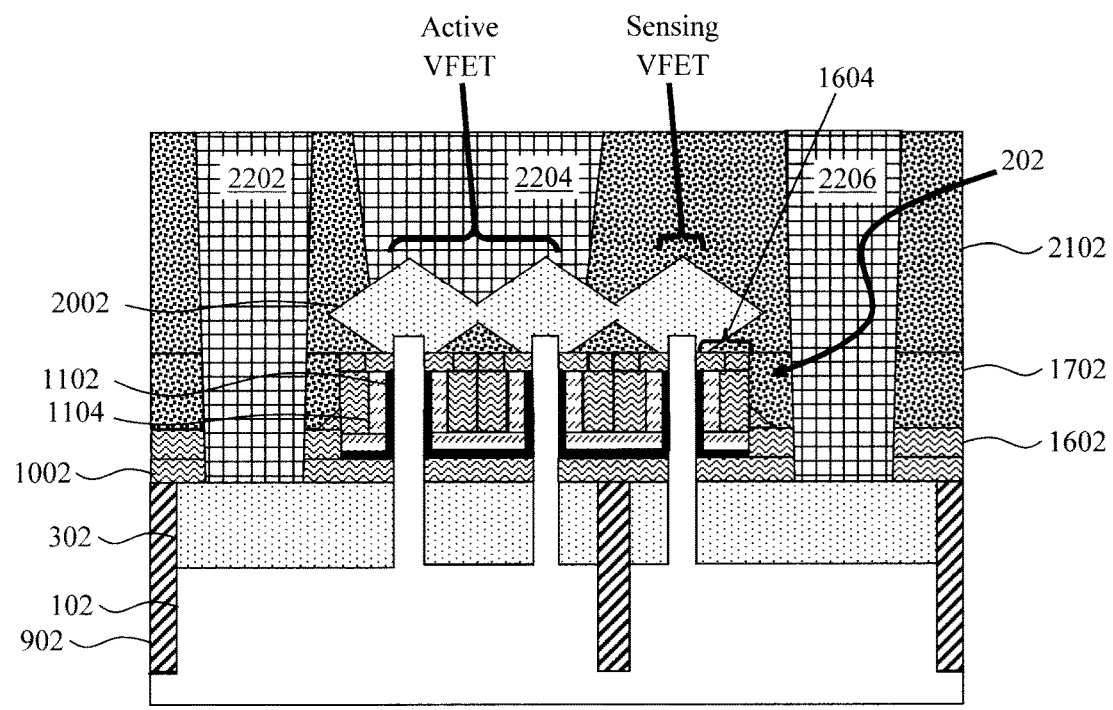
FIG. 22 is a cross-sectional diagram illustrating contacts having been formed in the ILD to: i) the bottom source and drains of the active VFET devices, ii) the top source and drains and iii) the bottom source and drains in the sensing VFET device according to an embodiment of the present invention.

As shown in FIG. 22, contacts 2202, 2204 and 2206 are then formed in the ILD 2102. By way of example only, the ILD 2102 is first patterned with the footprint and location of contacts 2202, 2204 and 2206, and then the pattern is filled with a contact metal (such as copper (Cu), tungsten (W), titanium (Ti), nickel (Ni) and/or platinum (Pt)) to form contacts 2202, 2204 and 2206. In this particular example, contact 2202 is formed to the bottom source and drains 302 of the active VFET devices. However, due to the isolation provided by STI regions 902 the bottom source and drains 302 of the active VFET devices are cut off from the bottom source and drains of the sensing VFET device.

As shown in FIG. 22, access to the bottom source and drains 302 in the sensing VFET device is provided via a separate contact 2206. As will be described in detail below, contact resistance measurements of the active VFET devices can be obtained by applying a volt meter to the contact 2206.

Contact 2204 is formed to the top source and drains 2002. In the example shown, the contact 2204 accesses the top source and drains above the active VFET devices. However, as provided above, the top source and drains 2002 of the active VFET and sensing VFET devices are merged. Thus, there is continuity throughout the top source and drains 2002 of both types of (active and sensing) VFET devices.

By accessing the top source and drains 2002 via contact 2204 above only the active VFET devices, one can get a more accurate measurement of the actual contact resistance for the active devices. To look at it another way, if one were to instead form the contact 2204 to the top source and drains 2002 over both types of (active and sensing) VFET devices, then the resulting resistance measurement would include an area of contact resistance with the sensing VFET device itself which is not the focus of the measurement.

It is notable that while the testing structure in FIG. 22 includes two active VFET devices and a single sensing VFET device, that configuration is merely an example meant to illustrate the present techniques. Namely, the present techniques may be implemented in the same manner described to produce test structures containing more (or fewer) active VFET devices and optionally more sensing VFET devices. Thus, the test structures provided herein generally include at least one active VFET device and at least one sensing VFET device with isolation between the bottom source and drains thereof.

Figure 23:
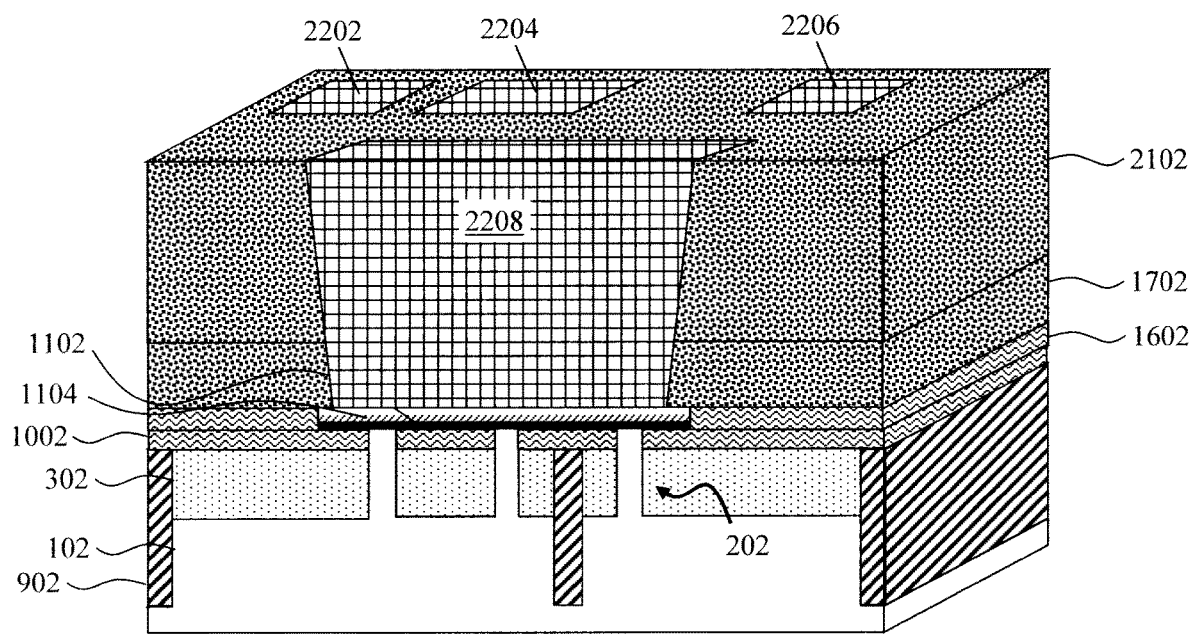
FIG. 23 is a three-dimensional diagram illustrating a (gate) contact having been formed in the ILD to the gate conductor in both types of (active and sensing) VFET devices according to an embodiment of the present invention.

FIG. 23 is a three-dimensional view of the test structure illustrating how a contact 2208 can also be formed in ILD 2102 to the gate conductor 1104 in both types of (active and sensing) VFET devices. Contact 2208 can be formed using the same process as contacts 2202, 2204 and 2206 as described above. The contact 2208 will be used during contact resistance measurements to turn on both the active VFET and sensing VFET devices. Thus, contact 2208 preferably provides a common (gate) contact to all of the VFET devices in the test structure.

Figure 24:
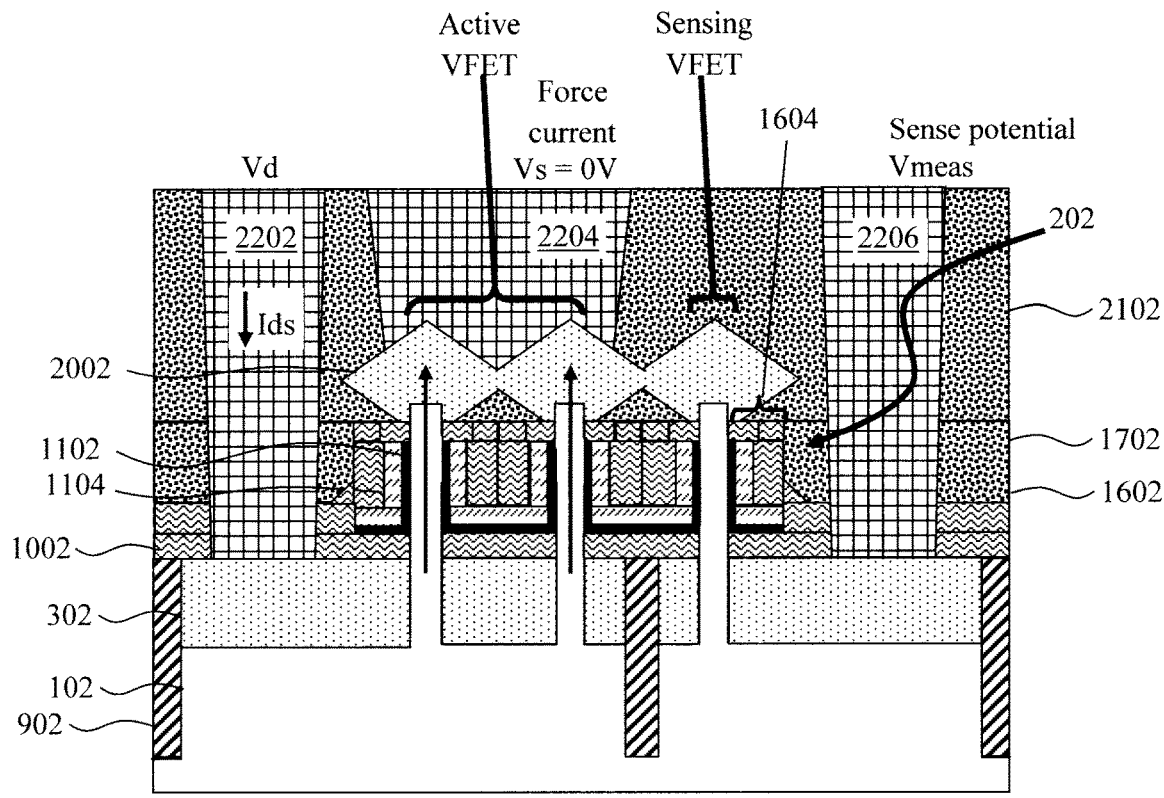
FIG. 24 is a cross-sectional diagram illustrating contact resistance measurement operations using the present test structure according to an embodiment of the present invention.
Figure 25:
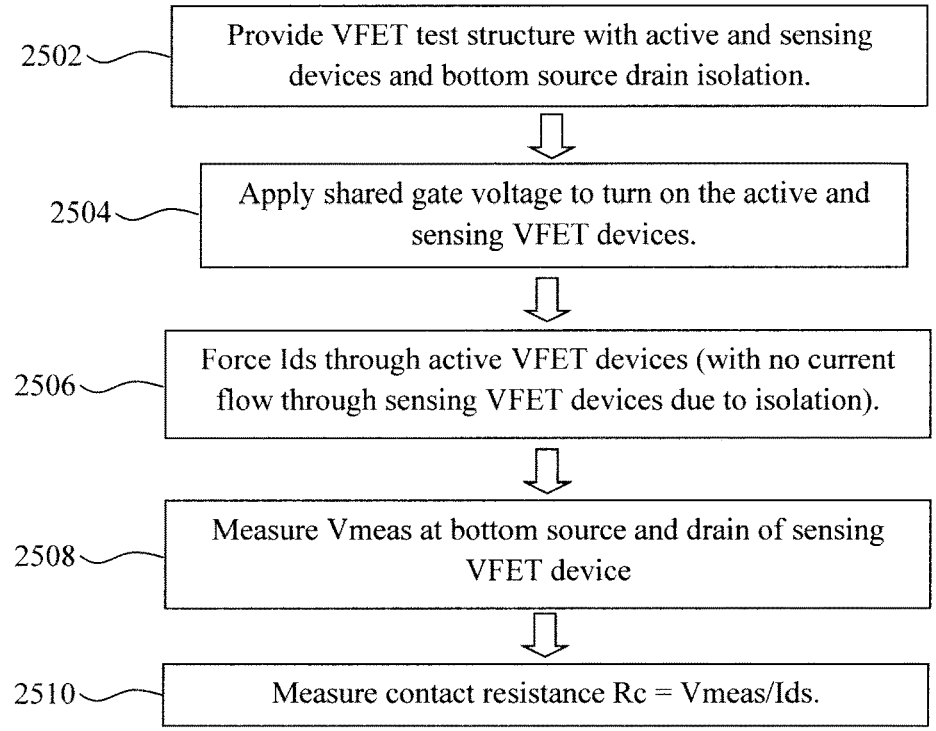
FIG. 25 is a diagram illustrating an exemplary methodology for measuring contact resistance according to an embodiment of the present invention.

Contact resistance measurement operations using the present test structure are now described by way of reference to FIGS. 23 and 24 in conjunction with methodology 2500 in FIG. 25. In step 2502 of methodology 2500, the present test structure is provided. According to an exemplary embodiment, the test structure is configured as shown in FIGS. 23 and 24.

Specifically, the test structure will include at least one active VFET device and at least one sensing VFET device. Each VFET (active and sensing) will include a vertical fin channel interconnecting bottom source and drains and top source and drains, and a gate surrounding the vertical fin channel offset from the bottom/top source and drains by top/bottom spacers. An STI region isolates the bottom source and drains of the active devices from that of the sensing device. The top source and drains of the active VFET and sensing VFET devices are merged. Separate contacts are present to both the source and drains of the active VFET and sensing VFET devices. A common contact to the (merged) top source and drain regions is present over the active VFET devices. A common (gate) contact is also present.

In step 2504, a gate voltage is applied to turn on both the active VFET and sensing VFET devices permitting current to flow therethrough. Referring to FIG. 23, a shared gate voltage can be applied to each of the VFET devices in the test structure via (gate) contact 2208.

In step 2506, a drain-source current Ids is forced between the (active VFET bottom source and drain) contact 2202 and the (top source and drain) contact 2204. See FIG. 24. As shown in FIG. 24, Ids can be generated by applying a voltage Vd to contact 2202 and connecting the contact 2204 to ground.

Due to the isolation (via STI region 902) in the bottom source and drains 302 between the active VFET and sensing VFET devices, no current Ids flows through the sensing VFET device. The only current flow will be through the fins 202 in the active VFET devices.

In step 2508, the potential Vmeas is sensed/detected at the (sensing VFET bottom source and drain) contact 2206. For instance, step 2508 can be performed using a volt meter connected to the contact 2206 to measure Vmeas. It is notable that a volt meter has a high internal resistance and will not cause current to flow through the sensing VFET device when connected to contact 2206. Based on the measured Vmeas and known Ids, the contact resistance (Rc) can be calculated in step 2510 using Equation 1, above.

Advantageously, based on the above-described process flow for fabricating the present VFET test structure, each VFET device (active and sensing which are co-fabricated) will have the same configuration, i.e., same components, and same dimensions as one another. For instance, the fins for both the active and sensing VFET devices are formed at the same time, and thus each device will have the same sized vertical fin channels, as well as the same top/bottom source and drains and gate configurations.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A vertical field effect transistor (VFET) contact resistance test structure, comprising:
    fins patterned in a substrate, wherein at least a first one of the fins serves as a vertical fin channel of an active VFET device and at least a second one of the fins serves as a vertical fin channel of a sensing VFET device;
    bottom source and drains at a base of the fins;
    a gate surrounding each of the fins;
    top source and drains over the gate, wherein the top source and drains of the active VFET device and the top source and drains of the sensing VFET device are merged; and
    contacts comprising: i) a contact to the bottom source and drains of the active VFET device, ii) a contact to the top source and drains, and iii) a contact to the bottom source and drains of the sensing VFET device, wherein the contact to the top source and drains directly contacts only the top source and drains of the active VFET device to permit measurement of actual contact resistance for the active VFET device.

2. The VFET contact resistance test structure of claim 1, further comprising:
    a shallow trench isolation (STI) region in the substrate in between the at least one first fin and the at least one second fin that provides isolation of the bottom source and drains of the active VFET device from the bottom source and drains of the sensing VFET device.

3. The VFET contact resistance test structure of claim 1, further comprising:
    bottom spacers disposed on the bottom source and drains.

4. The VFET contact resistance test structure of claim 3, wherein the bottom spacers comprise a material selected from the group consisting of: silicon dioxide ($SiO_2$), silicon carbon oxide (SiCO), silicon nitride (SiN), silicon boron carbon nitride (SiBCN), silicon oxycarbon nitride (SiOCN), silicon carbon nitride (SiCN), and combinations thereof.

5. The VFET contact resistance test structure of claim 1, further comprising:
    top spacers disposed on the gate.

6. The VFET contact resistance test structure of claim 5, wherein the top spacers comprise a material selected from the group consisting of: SiN, SiBCN, and combinations thereof.

7. The VFET contact resistance test structure of claim 1, wherein the bottom source and drains comprise a doped epitaxial material on the substrate at the base of the fins.

8. The VFET contact resistance test structure of claim 1, the gate comprises:
    a gate dielectric disposed on the fins; and
    a gate conductor disposed on the gate dielectric.

9. The VFET contact resistance test structure of claim 8, wherein the gate conductor comprises a workfunction-setting metal selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

10. The VFET contact resistance test structure of claim 8, wherein the gate dielectric comprises a high-κ material selected from the group consisting of: hafnium oxide ($HfO_2$), lanthanum oxide ($La_2O_3$), and combinations thereof.

11. The VFET contact resistance test structure of claim 1, further comprising:
    a gate contact to the gate.

12. The VFET contact resistance test structure of claim 1, wherein the top source and drains comprise a doped epitaxial material.

13. The VFET contact resistance test structure of claim 12, wherein the doped epitaxial material is selected from the group consisting of: doped epitaxial silicon (Si), doped epitaxial germanium (Ge) and doped epitaxial silicon germanium (SiGe).

14. A VFET contact resistance test structure, comprising:
    fins patterned in a substrate, wherein at least a first one of the fins serves as a vertical fin channel of an active VFET device and at least a second one of the fins serves as a vertical fin channel of a sensing VFET device;
    bottom source and drains at a base of the fins;
    a shallow trench isolation (STI) region in the substrate in between the at least one first fin and the at least one second fin that provides isolation of the bottom source and drains of the active VFET device from the bottom source and drains of the sensing VFET device;

a gate surrounding each of the fins;

top source and drains over the gate, wherein the top source and drains of the active VFET device and the top source and drains of the sensing VFET device are merged; and contacts comprising: i) a contact to the bottom source and drains of the active VFET device, ii) a contact to the top source and drains, and iii) a contact to the bottom source and drains of the sensing VFET device, wherein the contact to the top source and drains directly contacts only the top source and drains of the active VFET device to permit measurement of actual contact resistance for the active VFET device.

15. The VFET contact resistance test structure of claim 14, further comprising:

bottom spacers disposed on the bottom source and drains.

16. The VFET contact resistance test structure of claim 14, further comprising:

top spacers disposed on the gate.

17. The VFET contact resistance test structure of claim 14, wherein the bottom source and drains comprise a doped epitaxial material on the substrate at the base of the fins.

18. The VFET contact resistance test structure of claim 14, the gate comprises:

a gate dielectric disposed on the fins; and a gate conductor disposed on the gate dielectric.

19. The VFET contact resistance test structure of claim 14, further comprising:

a gate contact to the gate.

20. The VFET contact resistance test structure of claim 14, wherein the top source and drains comprise a doped epitaxial material selected from the group consisting of: doped epitaxial Si, doped epitaxial Ge and doped epitaxial SiGe.

* * * * *